United States Patent
Tyrrell et al.

(10) Patent No.: US 9,853,780 B2
(45) Date of Patent: Dec. 26, 2017

(54) DYNAMIC HARQ-ID RESERVATION

(71) Applicant: Rohde & Schwarz GmbH & Co. KG, Munich (DE)

(72) Inventors: Alexander Tyrrell, Ismaning (DE); William Powell, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 68 days.

(21) Appl. No.: 14/354,051

(22) PCT Filed: Oct. 24, 2012

(86) PCT No.: PCT/EP2012/071030
§ 371 (c)(1),
(2) Date: Apr. 24, 2014

(87) PCT Pub. No.: WO2013/060713
PCT Pub. Date: May 2, 2013

(65) Prior Publication Data
US 2014/0281782 A1    Sep. 18, 2014

(30) Foreign Application Priority Data
Oct. 24, 2011  (DE) .................. 10 2011 085 075

(51) Int. Cl.
*H04L 1/18*  (2006.01)
*H03M 13/00*  (2006.01)

(52) U.S. Cl.
CPC ............. *H04L 1/1896* (2013.01); *H04L 1/18* (2013.01); *H03M 13/6306* (2013.01); *H04L 1/1867* (2013.01); *H04L 1/1874* (2013.01)

(58) Field of Classification Search
CPC ................ H03M 13/6306; H04L 1/18–1/1896
See application file for complete search history.

(56) References Cited

U.S. PATENT DOCUMENTS

2009/0103500 A1    4/2009  Malkamaki et al.
2009/0279633 A1*   11/2009 Lee ...................... H04L 1/0643
                                                                375/267
(Continued)

FOREIGN PATENT DOCUMENTS

EP    2 291 019 A1    3/2001
EP    2 104 261 A1    9/2009

OTHER PUBLICATIONS

International Search Report for corresponding International Application No. PCT/EP2012/071030 dated Dec. 18, 2012, 7 pages.
(Continued)

*Primary Examiner* — Sam Rizk
*Assistant Examiner* — Christian Dorman
(74) *Attorney, Agent, or Firm* — Ditthavong & Steiner, P.C.

(57) ABSTRACT

The method is used for detection and/or removal of errors in transmission systems which comprise a transmitter unit and at least one receiver unit. The transmitter unit transmits to the receiver unit on a semi-persistent transmission resource which provides an adjustable frequency range and an adjustable time period. Furthermore, the self-repeating, semi-persistent transmission resource repeating with the period $T_{SPS}$ is rigidly assigned to the receiver unit. Following this, at least one but not all of the HARQ process numbers available for the self-repeating, semi-persistent transmission resource are reserved for the latter.

5 Claims, 4 Drawing Sheets

(56) References Cited

U.S. PATENT DOCUMENTS

| | | |
|---|---|---|
| 2009/0287976 A1 | 11/2009 | Wang et al. |
| 2010/0017671 A1 | 1/2010 | Cai et al. |
| 2010/0031111 A1 | 2/2010 | Cai et al. |
| 2010/0098006 A1* | 4/2010 | Golitschek Edler Von Elbwart . H04L 1/1861 370/329 |
| 2010/0202302 A1 | 8/2010 | Cai et al. |
| 2010/0325503 A1 | 12/2010 | Womack et al. |
| 2011/0093756 A1 | 4/2011 | Yang et al. |
| 2011/0145672 A1* | 6/2011 | Jongren ................ H04L 1/1854 714/748 |
| 2011/0182245 A1 | 7/2011 | Malkamaki et al. |
| 2011/0182258 A1* | 7/2011 | Moon .................... H04L 1/1893 370/329 |

OTHER PUBLICATIONS

Notification of Transmittal of Translation of the International Preliminary Report on Patentability; International Preliminary Report on Patentability; and Written Opinion of the International Searching Authority for corresponding International Application No. PCT/EP2012/071030, dated May 8, 2014, 14 pages.

\* cited by examiner

DYNAMIC HARQ-ID RESERVATION

CROSS-REFERENCE TO RELATED APPLICATION

The present application is a national phase application of PCT Application No. PCT/EP2012/071030, filed Oct. 24, 2012, and claims priority to German Application No. DE 10 2011 085 075.9, filed on Oct. 24, 2011, the entire contents of which are herein incorporated by reference.

BACKGROUND OF THE INVENTION

Field of the Invention

The invention relates to a method and a device for the dynamic reservation of HARQ process numbers for a transmission resource especially in the case of LTE.

Discussion of the Background

The number of terminal devices for mobile communication has been increasing worldwide, as has the desire to implement applications with these terminal devices which require a fast transmission rate and have hitherto been limited to classic computer systems. For this reason, existing mobile-radio networks are constantly being expanded. The latest mobile-radio standard for this purpose is LTE (English: Long Term Evolution; German: Langzeitentwicklung), which has been standardized by the 3GPP (English: 3rd Generation Partnership Project; German: Partnerschaftliches Projekt der dritten Generation).

Dependent upon the digital modulation type used, approximately 100 Mbits/s per antenna can be transmitted from the base-station to a mobile-terminal device. In this context, the payload data are transmitted from the base-station to the mobile-terminal device on the PDSCH (English: Physical Downlink Shared Channel; German: geteilter physikalischer Kanal auf der Abwartsstrecke). A different number of frames (German: Rahmen), which are 10 ms long and contain ten subframes (German: Unterrahmen), is provided within the PDSCH dependent upon the bandwidth, whereas each subframe comprises two slots (German: Schlitze). Each subframe lasts 1 ms and contains between 6 and 100 resource blocks (1.4 MHz to 20 MHz). A resource block lasts 1 ms and contains 12 orthogonal carriers which are spaced 15 kHz from one another (special carrier intervals of 7.5 kHz are also possible). A radio resource (English: radio resources), which is also referred to below as a transmission resource, can be described as a two-dimensional time-frequency matrix, which corresponds to a set of OFDM symbols (English: Orthogonal Frequency Division Multiplexing; German: Orthogonales Frequenzmultiplexverfahren) and subcarriers (English: subcarrier). In the case of LTE, the smallest unit for the transmission of data comprises a pair of radio resources with a bandwidth of 180 kHz during a subframe 1 ms long, whereas, in the following description, the term radio resource, or also transmission resource, defines a bandwidth of 180 kHz during a 1 ms-long subframe.

As soon as the base-station transmits payload data to the mobile-terminal device, the latter notifies the mobile-terminal device, inter alia, on which subframe and in which frame the payload data are transmitted. Accordingly, the base-station notifies the mobile-terminal device regarding the location of the transmission resource in the time and frequency domain. This notification takes place on the PDCCH channel (English: Physical Downlink Control Channel; German: physikalischer Kontrollkanal auf der Abwartsstrecke). If very many users of the base-station receive only very small data packets at periodic intervals, a great many messages must be exchanged over the PDCCH. Accordingly, a mismatch occurs between the transmitted payload data by comparison with the transmitted control data, and the overhead increases. In order to counteract this problem, the SPS protocol (English: Semi-Persistent Scheduling; German: Kalb-statische Zeitplanung), the standard underlying the LTE, has been added by the 3GPP. With the use of SPS, the transmission resources can be configured in a semi-persistent manner and are assigned to a mobile-terminal device for a time period which is longer than one subframe. Following this, no further control messages or control data for the assignment of a transmission resource are transmitted on the PDCCH, subject to the exception that the semi-persistent assignment of the transmission resource is cancelled again.

In this context, the period with which the transmission resources are repeated is communicated to the mobile-terminal device, so that the latter can receive the periodically communicated payload data and/or scheduling grants (English: scheduling grants). The overhead between the transmitted payload data and the control data is therefore significantly reduced.

HARQ (English: Hybrid Automatic Repeat Request; German: hybride automatische Wiederholungsanfrage), also referred to as hybrid ARQ processes, are used to determine and correct transmission errors. HARQ is an expanded variant of the ARQ transmission security method, in which the ARQ mechanisms (checksum formation, block acknowledgement, block repetition) are combined with an error-correction coding. For this purpose, various HARQ processes are available at the transmitter end and also at the receiver end, within the MAC layer (English: Medium Access Control Layer; German: mittlere Zugriffskontrollschicht). Altogether, eight different HARQ process numbers (0 to 7) are provided for each receiver at the transmitter end, and also at the receiver end. In order to achieve a valid result, the data packets which are transmitted from the base-station to the mobile-terminal device and processed, for example, in the base-station, using the HARQ process which provides the process number 1, must also be processed in the mobile-terminal device using the HARQ process which provides the process number 1.

Fixed HARQ process numbers are assigned to the transmission resources configured in a semi-persistent manner by SPS. For example, the operator of a base-station can specify that the HARQ process numbers 0 to 3 should be used only for SPS transmission resources. These HARQ process numbers are then no longer available for other transmission resources between the base-station and the corresponding mobile-terminal device. This can lead to the situation that no further HARQ processes are available for the normal transmission resources, so that the data rate for the latter can collapse.

A method and a device which allow HARQ process numbers to be supplied to a common pool after a successful SPS transmission is known from US 2009/0287976 A1. HARQ process numbers which have been supplied to this pool can also be used for normal transmission resources. The disadvantage with US 2009/0287976 A1 is that, with a common pool in which all HARQ process numbers are stored after a successful transmission, it is not guaranteed that the HARQ process number required for the next SPS-configured transmission resource is free and can be used.

A randomly free HARQ process number cannot be used for an SPS-configured transmission resource.

SUMMARY OF THE INVENTION

Embodiments of the method according to the invention and the device according to the invention advantageously provide a solution to guarantee that a HARQ process number is always available for SPS-configured transmission resources, whereas, at the same time, it should also be guaranteed that a HARQ process is also available for normal transmission resources.

Embodiments of the method according to the invention for detection and/or removal of errors in transmission systems comprise a transmitter unit and at least one receiver unit, whereas the transmitter unit transmits payload data to the at least one receiver unit on a semi-persistent transmission resource which provides an adjustable frequency range and an adjustable time period. In a first method step, self-repeating, semi-persistent transmission resources repeating with the period $T_{SPS}$ are rigidly assigned to at least one receiver unit. In the further course, at least one but not all of the HARQ process numbers provided for the self-repeating, semi-persistent transmission resources are reserved for the latter.

With the embodiments of the method according to the invention, it is particularly advantageous that not all of the HARQ process numbers provided for the self-repeating, semi-persistent transmission resources are reserved for the latter. This means that the non-reserved HARQ processes can be used for the transmission of payload data on the normal transmission resources and at the same time guarantees that at least one HARQ process can always be used for a semi-persistent transmission resource, that is, for an SPS-configured transmission resource.

Embodiments of the device according to the invention for detection and/or removal of errors in transmission systems between a transmitter unit and at least one receiver unit comprise a transmitter unit which transmits payload data to the at least one receiver unit on a semi-persistent transmission resource, which provides an adjustable frequency range and an adjustable time period. A control unit which assigns a self-repeating, semi-persistent transmission resource repeating with the period $T_{SPS}$ to the at least one receiver unit is embodied in the transmitter unit. The control unit reserves at least one but not all of the HARQ process numbers provided for the self-repeating, semi-persistent transmission resource.

It is particularly advantageous with the embodiments of the device according to the invention that not all of the HARQ process numbers provided for the self-repeating, semi-persistent transmission resources are reserved for the latter. This allows the unreserved HARQ processes to be used for the transmission of payload data on the normal transmission resources and at the same time guarantees that at least one HARQ process is always available for a semi-persistent transmission resource, that is, can be used for an SPS-configured transmission resource.

A further advantage is achieved with the embodiments of the method according to the invention if the HARQ process numbers which can be used for a transmission of the payload data on the self-repeating, semi-persistent transmission resource but which are not reserved for the latter are released for at least one further transmission process from the transmitter unit to the at least one receiver unit. This ensures that an adequate number of HARQ processes are always available for transmissions on the other transmission resources.

Finally, an advantage is achieved with the embodiments of the method according to the invention if that HARQ process number for which a transmission of payload data on one of the self-repeating, semi-persistent transmission resources has been successful is released for at least one further transmission process from the transmission unit to the at least one receiver unit which uses another transmission resource. This allows an adequate number of HARQ processes always also to be available for transmissions on the other transmission resources.

Moreover, an advantage is achieved with the embodiments of the device according to the invention, if the control unit reserves a number of HARQ process numbers which are used for the semi-persistent transmission resource, whereas the number of HARQ process numbers to be reserved is dependent upon the period $T_{SPS}$ of the self-repeating, semi-persistent transmission resource and whereas that HARQ process number is reserved which is required for the at least one semi-persistent transmission resource. This means that, in the case of relatively short periods for $T_{SPS}$, more HARQ process numbers are reserved than in the case of relatively longer periods for $T_{SPS}$, so that it can always be guaranteed that, even in the case of an error transmission after which the same HARQ process number is needed for a re-transmission, this is available again in the next cycle. Furthermore, it is particularly advantageous if at least the HARQ process with the number which is needed for the at least one next semi-persistent transmission resource is reserved, because this guarantees that the latter is not used for data transmission on another, that is, a normal, transmission resource.

With the embodiments of the device according to the invention, an advantage is also achieved if the semi-persistent transmission resource relates to radio resources which are configured semi-persistently by the control unit by means of SPS and are assigned to a receiver unit for a relatively longer time period than one subframe and/or if the transmitter unit is an LTE base-station and the at least one receiver unit is an LTE receiver unit and/or if the control unit dynamically varies the number of HARQ process numbers to be reserved and/or if the control unit reduces the number in the case of a high data volume on the other transmission resources from the transmitter unit to the at least one receiver unit and/or if the control unit increases the number in the case of a low data volume on the other transmission resources and/or if less of the HARQ process numbers assigned for the semi-persistent transmission resource are reserved in the case of a relatively high-quality or good-quality of the transmission channel than in the case of a relatively poor quality of the transmission channel and/or if the payload data which are transmitted via the semi-persistent transmission resource are VoIP data (English: Voice over Internet Protocol; German: Sprache fiber Internet Protokoll).

It is particularly advantageous that the number of HARQ process numbers which are reserved for the semi-persistent transmission resource is varied dependent upon the quality of the transmission channel or of the data volume on the other transmission resources. In this context, the maximum number of reservable HARQ process numbers can correspond to the number of the HARQ process numbers which are available for semi-persistent transmission resources. This ensures that critical applications, such as VoIP data packets which are transmitted via the semi-persistent transmission resources reach the receiver without major delays.

BRIEF DESCRIPTION OF THE DRAWINGS

Various exemplary embodiments of the invention are described by way of example below with reference to the drawings. Identical subject matters provide the same reference numbers. In detail, the corresponding figures of the drawings show.

DETAILED DESCRIPTION OF EXEMPLARY EMBODIMENTS OF THE INVENTION

Figure 1:
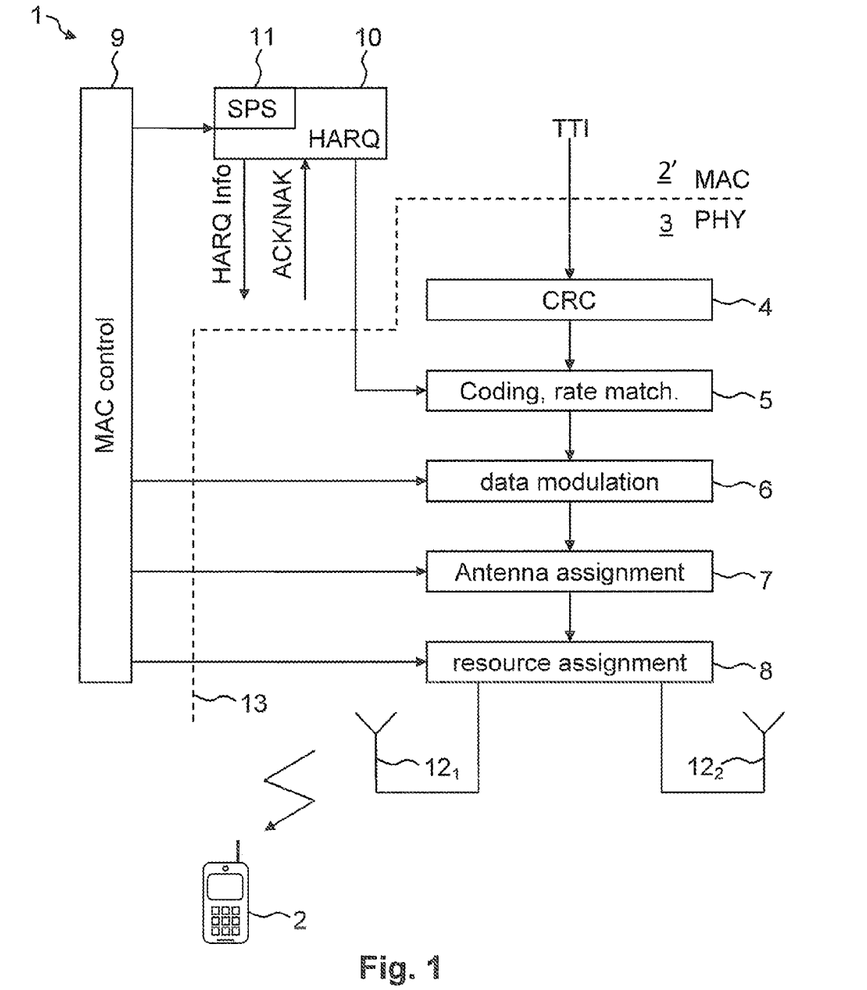
FIG. 1 an exemplary embodiment of a block-circuit diagram which describes the device according to the invention in greater detail.

FIG. 1 shows an exemplary embodiment of a block-circuit diagram which describes the device 1 according to the invention in greater detail. The device 1, which can be, for example, an LTE transmitter unit 1, shows a rough structure for the downlink, that is, the transmission of data from the LTE transmitter unit 1 to a receiver unit 2. The receiver unit 2 in the exemplary embodiment is also an LTE receiver unit 2, for example, a mobile-terminal device.

FIG. 1 shows the considerably simplified structure of an LTE transmitter unit 1. Two layers, the MAC layer 2' and the physical layer 3, which are separated from one another by a dotted line 13, are shown. The physical layer 3 is responsible for the coding of the HARQ processing, the modulation, the processing of the antennas and the mapping of the signal onto the corresponding physical transmission resources in the time-frequency domain. Moreover, the physical layer 3 is responsible for the mapping of the transport channels onto the physical channels. The payload data to be transmitted are subdivided between the individual TTI-blocks (English:Transmission Time Interval; German: Zeitintervall fürÜbertragung). If spatial multiplexing is available, that is, if the LTE transmitter unit broadcasts data via several antennas at the same time on the same frequency, there are several of these TTI blocks.

For the payload data which are transmitted on the DLSCH (English: Downlink Shared Channel; German: gemeinsamer Abwäartskanal), a checksum is calculated in a first processing unit 4. In this context, CRC stands for Cyclic Redundancy Check (German: zyklische Redundanzprüfung). The checksums (CRC) calculated by the first processing unit allow the receiver unit 2 to identify errors.

Following this, a coding and data matching is implemented within a second processing unit 5. In this context, the output of the first processing unit 4 is connected to the input of the second processing unit 5. The second processing unit 5 preferably contains an option for processing the payload data by means of turbo-coding, so that transmission errors can be corrected in the receiver unit 2. Rate matching is used not only for matching the number of bits to be transmitted to the number of transmission resources available on the DLSCH, but additionally for generating various redundant versions, as provided by the HARQ protocol.

The second processing unit 5 is connected in turn to a third processing unit 6. Within the first processing unit 6, a digital modulation by means of QPSK (English: Quadrature Phase-Shift Keying; German: Quadraturphasenumtastung) or 16 QAM (English: Quadrature Amplitude Modulation; German: Quadraturamplitudenmodulation) 64 QAM is implemented.

The third processing unit 6 is further connected to a fourth processing unit 7. The fourth processing unit 7 is responsible for the antenna assignment and supports various multi-antenna transmission schemes. These include diversity transmission, beam forming (German: Richtbildung) and spatial-multiplexing (German: räumliches Multiplexing).

The output of the fourth processing unit 7 is connected to a fifth processing unit 8. Within the fifth processing unit 8, an assignment to the physical resources used within the DLSCH is implemented.

The third processing unit 6, the fourth processing unit 7 and the fifth processing unit 8 are controlled by a central control unit 9. Another HARQ processing unit 10 is also connected to the central control unit 9. The HARQ processing unit 10 is also connected to the second processing unit 5. The HARQ processing unit 10 receives packets which specify whether a packet transmitted from the LTE transmitter unit 1 has been correctly received by the receiver unit 2. These specifications are ACK (English: positive acknowledgement; German: positive Rückmeldung) and NAK packets (English: negative acknowledgement; German: negative Rückmeldung), which are transmitted on the PHICH (English: physical hybrid ARQ indicator channel, German: physikalischer Hybrid-ARQ-Kanalindikator). Furthermore, the HARQ information is prepared and transmitted by the HARQ processing unit 10.

The SPS control unit 11, which is referred to below as the control unit 11, is also disposed within the HARQ processing unit 10. As will be explained in due course, the control unit 11 is responsible for assigning the various HARQ processes to the transmission resources. As already explained, a fixed number of HARQ processes are assigned for the transmission resources configured in a semi-persistent manner, that is, the SPS-configured transmission resources.

The fifth processing unit 8 in the exemplary embodiment from FIG. 1 is further connected to two antennas $12_1$, $12_2$. However, it is also possible for only one antenna to be connected to the fifth processing unit 8, or for a total of N antennas to be connected to the fifth processing unit 8.

Figure 2:
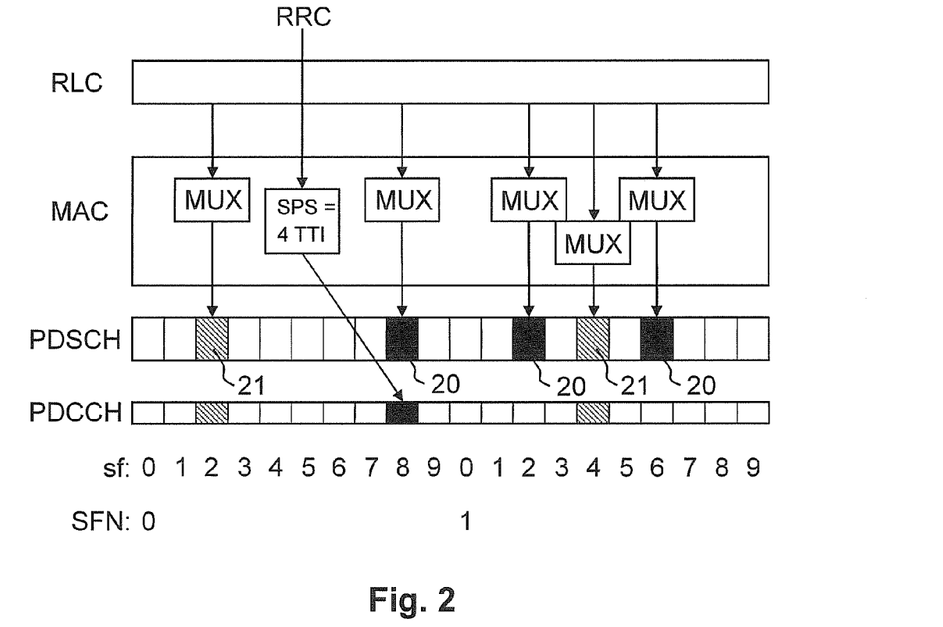
FIG. 2 an exemplary embodiment which describes the persistent and dynamic assignment of transmission resources in greater detail from the perspective of the base-station.

FIG. 2 shows an exemplary embodiment which describes the persistent and dynamic assignment of transmission resources from the perspective of the base-station in greater detail. Various layers, namely, the RRC layer (English: Radio Resource Control; German: Funkenressourcenkontrolle), the RLC layer (English: Radio Link Control; German: Funkenverbindungskontrolle) and the MAC layer. Furthermore, the two physical transport channels PDSCH and PDCCH are shown. Moreover, two frames, each of which comprises ten subframes, which are numbered from 0 to 9, are also shown. The marking "sf" in this context denotes subframe and the marking "SFN" denotes subframe number, that is, the frame to which the corresponding subframe belongs.

For instance, within FIG. 2, a transmission of payload data takes place on the PDSCH in subframe two of the first frame and in subframe four of the second frame. The transmission resources 21 required for this are assigned dynamically to the receiver unit 2. This is evident from the fact that a transmission of control data also takes place on the PDCCH of the second subframe of the first frame and of the fourth subframe of the second frame. The dynamic assignment of the two transmission resources 21 to one receiver unit 2 is shown with a black/white hatching. In this context, the data come from the RLC layer and are transferred to the MAC layer. A processing of the data is implemented within the MAC layer, as is shown in FIG. 1. Following this, the data are transmitted on a transmission resource 21 on the PDSCH to the at least one mobile-terminal device 2. At the same time, control information is transmitted via the PDCCH to the at least one receiver unit 2. With such a dynamic allocation of transmission resources 21, it is clearly evident that messages must always be exchanged on the PDCCH with the actual data packet which is transmitted on the PDSCH.

This overhead can be minimized with the use of SPS. It is clearly evident that, via the RRC layer, the control unit 11 is notified, within the MAC layer that a transmission resource 20 is to be configured in a semi-persistent manner. The control unit 11 is notified via the RRC layer that the transmission resource 20 is to be configured in a semi-persistent manner, that is, for SPS in subframe 8 in the first frame (Frame 0). It is also specified that the period $T_{SPS}$ with which the semi-persistent transmission resources 20 are repeated, TTI=4, should therefore be four subframes. For this purpose, the mobile-terminal device 2 is notified, on the PDDCH in subframe eight of the first frame (0), that the transmission resource 20 on the PDSCH is configured in a semi-persistent manner, that is, for SPS. Starting from this subframe, data can be transmitted from the transmitter unit 1 to the at least one receiver unit 2 on all of the subsequent subframes, which are distanced from one another by the previously determined period $T_{SPS}$, without the need to communicate additional control information to the at least one receiver unit 2 on the PDCCH.

Within FIG. 2, the semi-persistently configured transmission resources 20 are marked with a black infill. In this context, it is evident that all four subframes, starting with the eighth subframe in the first frame (0), transmit payload data to the at least one mobile-terminal device 2 on the PDSCH. However, in this context, control data are transmitted only on the first, semi-persistently configured transmission resource 20 to the at least one mobile-terminal device 2. No control data are transmitted to the at least one further receiver unit 2 on the PDCCH in the second subframe and in the sixth subframe in the second frame (1). At the same time, however, payload data are transmitted at this time to the at least one further receiver unit 2 on the PDSCH.

Figure 3:
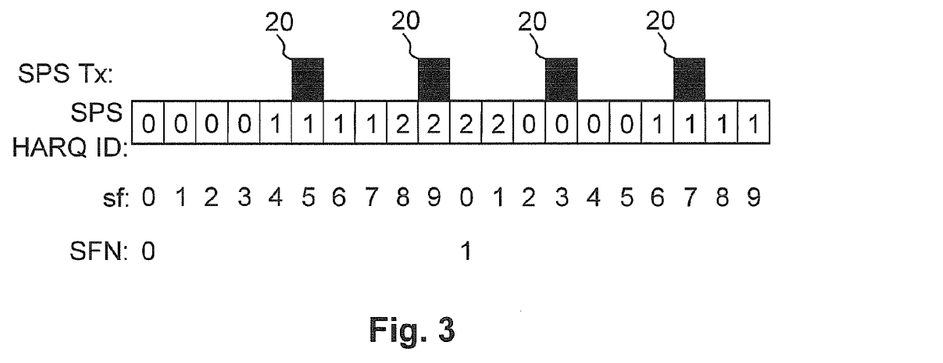
FIG. 3 an exemplary embodiment which describes the assignment to the semi-persistent transmission resources of the HARQ process numbers which can be used for the semi-persistent transmission resources.

FIG. 3 shows an exemplary embodiment, which describes the assignment of the HARQ process numbers, which can be used for the semi-persistent transmission resources 20, to the semi-persistent transmission resources 20. From the total of eight HARQ process numbers (0 to 7), it can be established, which should be used for SPS-configured transmission resources 20.

If four HARQ processes are to be used for the semi-persistent transmission resources 20, the lowest HARQ process numbers are automatically used. In this case, the HARQ process numbers zero to three are assigned to the semi-persistent transmission resources 20. If three HARQ process numbers can be used for the semi-persistent transmission resources 20, FIG. 2 shows very clearly which HARQ process number is valid in which subframe of which frame. The period, with which the semi-persistent transmission resources 20 are repeated is specified in the exemplary embodiment from FIG. 2 as $T_{SPS}$. According to equation (1), the control unit 11 can calculate which HARQ process number must be used for the transmission of payload data in the next semi-persistent transmission resource 20.

$$\text{HARQ process number} = [\text{floor}(t/T_{SPS})] \bmod N_{SPS} \quad (1)$$

The valid HARQ process number is calculated according to equation (1), whereas t=10*SFN+sf. Accordingly, t specifies the subframe, for which the HARQ process number should be determined. Selecting the value t=2 requests the HARQ process number of the subframe disposed in the second position. $T_{SPS}$ specifies the period with which the semi-persistently configured transmission resources 20 are repeated. In the example from FIG. 3 the value 4 is selected for $T_{SPS}$. This means that the semi-persistently configured transmission resources 20 are repeated every 4 ms. In reality, significantly higher values are selected. For example, if 20 VoIP data packets are to be transmitted on the semi-persistently configured transmission resources 20, the value 20 is selected for $T_{SPS}$, because the VoIP codec generates a new data packet every 20 ms. $N_{SPS}$ specifies the number of HARQ processes, which are to be used for the semi-persistently configured transmission resources. In the exemplary embodiment from FIG. 3, the value for $N_{SPS}=3$. This means that only the HARQ processes with the process numbers 0, 1 and 2 can be used for the semi-persistently configured transmission resources 20. Accordingly, the value for $N_{SPS}$ can be a maximum of 8, whereas the smallest HARQ process numbers are always assigned to the semi-persistently configured transmission resources 20. It is evident that the HARQ process numbers are repeated in a cyclic manner and that each HARQ process number is valid for $T_{SPS}$ successive subframes. In the exemplary embodiment from FIG. 3, the transmission resources 20 in the fifth and ninth subframe of the first frame (SFN=0) and in the third and seventh subframe of the second frame (SFN=1) are configured semi-persistently, that is, for SPS.

The determination of the HARQ process numbers according to equation (1) is reproduced, for example, in the corresponding standardization document of the 3GPP under TS 36.321, which, like the standardization document TS 36.213, is included in full within the present document. The calculation of equation (1) can be implemented, for example, in the control unit 11.

Furthermore, by means of equation (2), it is possible to request the subframe in which the next transmission of a semi-persistently configured transmission resource 20, that is, of an SPS transmission resource 20, takes place.

$$T_{SPS}[n] = (10*SFN + sf) = [(10*SFN_{SPS,start} + sf_{SPS,start}) + n*T_{SPS}] \bmod 10240 \quad (2)$$

In the exemplary embodiment from FIG. 3, $SFN_{SPS,start}=0$, because, the first transmission takes place on a semi-persistently configured transmission resource 20 in the first frame (SFN=0). The value for $sf_{SPS,start}$ in the exemplary embodiment from FIG. 3 is $sf_{SPS,start}=5$, because the first transmission on a semi-persistently configured transmission resource has taken place in the sixth subframe (sf=5). By means of the above equation, it is possible to calculate in each case the subframe in which the next transmission on a semi-persistently configured transmission resource 20 takes place for the case that the counter variable n is incremented in each case by one. The result of $T_{SPS}[n]$ can be inserted into equation (1) for $T_{SPS}$, in order to determine the HARQ process number for the next transmission on a semi-persistently configured transmission resource 20. Equation 2 is preferably also calculated in the control unit 11. Moreover, equation 2 can be taken from the underlying standard for the 3GPP in TS 36.321.

By calculating equation (1) and (2), the control unit 11 according to the invention can determine when a new transmission on a semi-persistently configured transmission resource 20 will take place and which HARQ processes must be used for this purpose with which process numbers.

FIG. 3 also shows very clearly that, in the case of an error transmission of payload data, sufficient time remains in order to re-transmit the erroneously transmitted payload data. For this re-transmission, the same HARQ process number must also be used. A re-transmission takes place approximately 4 ms after the first transmission. In the exemplary embodiment from FIG. 3, the transmission of the payload data can therefore be repeated up to twice, before the HARQ process number for the transmission of the next payload data is needed again.

Figure 4:
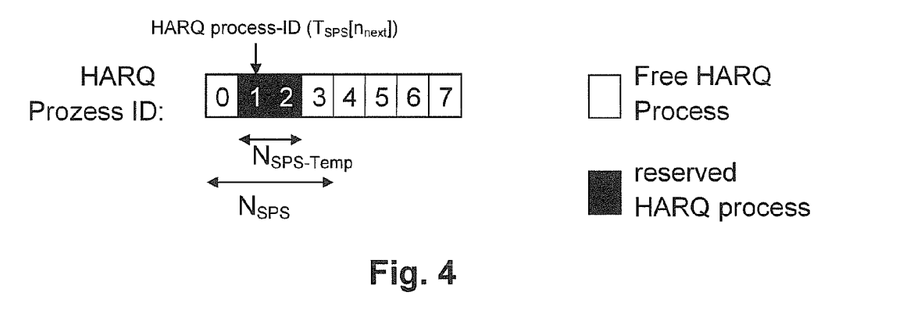
FIG. 4 an exemplary embodiment which describes how the device according to the invention reserves some of the available HARQ process numbers for the semi-persistent transmission resources.

FIG. 4 shows an exemplary embodiment which describes how the device 1 according to the invention reserves some of the available HARQ process numbers for the semi-persistent transmission resources 20. As already explained, it is disadvantageous if all of the HARQ process numbers available for the semi-persistent transmission resources 20 can no longer be used by any other transmission resources 21.

According to the exemplary embodiment from FIG. 3, a further five HARQ processes would now be available for other transmission resources 21, because three HARQ processes ($N_{SPS}$=3) are reserved for the semi-persistent transmission resources 20, even if these are not constantly needed by the latter.

Accordingly, the control unit 11 according to the invention reserves at least one but not all of the HARQ process numbers available for the self-repeating, semi-persistently configured transmission resources 20. By preference, the control unit 11 according to the invention reserves a number of HARQ process numbers which are used for the semi-persistently configured transmission resources 20, whereas the number of HARQ process numbers to be reserved depends upon the period $T_{SPS}$ of the self-repeating, semi-persistently configured transmission resources 20. In this context, that HARQ process number is reserved, which are needed for the at least one semi-persistently configured transmission resource 20.

FIG. 4 explains this exemplary embodiment in great detail. By means of the equations (1) and (2), the control unit 11 according to the invention determines which HARQ process number is needed for the next semi-persistently configured transmission resource 20 in order to transmit payload data via the latter. In the exemplary embodiment from FIG. 4, the HARQ process number one is then needed as a next step. Consequently, the control unit 11 according to the invention reserves this process number in advance.

Table (1) shows, for example, that not only the next HARQ process number is reserved by the control unit 11 according to the invention, but a different number of HARQ process numbers are reserved dependent upon the period $T_{SPS}$.

TABLE (1)

| $T_{SPS}$ | $N_{SPS-Temp}$ |
|---|---|
| sf · 10 | 3 |
| sf · 20, sf · 32 | 2 |
| >sf · 32 | 1 |

If the period $T_{SPS}$=10×sf, that is, one semi-persistently configured transmission resource 20 is repeated every ten subframes, it is proposed that the control unit 11 according to the invention reserves the next three HARQ process numbers. This is explained by the fact that $N_{SPS-Temp}$=3. For example, if the period $T_{SPS}$=20×sf or $T_{SPS}$=32×sf, that is, if the semi-persistently configured transmission resources 20 are repeated every 20 subframes or every 32 subframes, it is proposed that the control unit 11 according to the invention reserves only the next two HARQ process numbers. The value for $N_{SPS-Temp}$ in this case is two, as shown in Table (1). If the period is $T_{SPS}$>sf×32, that is, if the semi-persistently configured transmission resources 20 are repeated at an interval of more than 32 subframes, only the HARQ process number required as the next one is reserved by the control unit 11 according to the invention, as explained by $N_{SPS-Temp}$=1.

In FIG. 4, the value for $N_{SPS-Temp}$ is fixed at 2. It is evident that the HARQ process numbers one and two have been reserved by the control unit 11 according to the invention. By contrast, the HARQ process numbers zero and three have not been reserved by the control unit 11 according to the invention for the HARQ-persistent configured transmission resources 20. The HARQ process numbers zero and three can therefore also be used by other transmission resources 21. The value for $N_{SPS-Temp}$ should be selected in such a manner that, even with the occurrence of transmission errors, the necessary HARQ process number can still be used in order to achieve a successful re-transmission with an adequate probability, before the HARQ process number is needed again for the transmission of payload data within a semi-persistently configured transmission resource 20.

As shown in FIG. 4, the control unit 11 according to the invention releases those HARQ process numbers which can be used for a transmission of the payload data on the self-repeating HARQ-persistent configured transmission resources 20, but which have not been reserved for these by the control unit 11 according to the invention. These released HARQ process numbers can then be used for at least one further transmission process 21 from the transmitter unit 1 to the at least one receiver unit 2. As shown in FIG. 4, these are the HARQ process numbers zero and three.

The control unit 11 according to the invention releases a HARQ process number for the at least one other transmission resource 21 only if the following applies: $N_{SPS-Temp}$<$N_{SPS}$.

In this case, the control unit 11 according to the invention releases the HARQ process number if a transmission of the payload data on one of the self-repeating, semi-persistently configured transmission resources 20 has been successful, because, in the case of an unsuccessful transmission, the HARQ process number must be used for the re-transmission of the same payload data. If the transmission of the payload data was successful, the HARQ process number can be used for at least one further transmission process from the transmitter unit 1 to the at least one receiver unit 2, whereas this transmission process uses another transmission resource 21.

This other transmission resource 21 is preferably not a self-repeating, semi-persistently configured transmission resource 20.

The number of HARQ process numbers to be reserved as suggested in Table (1) can also be varied dynamically during the operation of the transmitter unit 1 according to the invention by the control unit 11 according to the invention. In this manner, with a relatively high quality of the transmission channel, fewer of the HARQ process numbers assigned for the semi-persistent transmission resources 20 can be reserved than in the case of a relatively poor quality of the transmission channel, because the probability that payload data need to be transmitted more than twice before the transmission process is successful is very low. A relatively high quality and a relatively poor quality of the transmission channel are measured according to an adjustable threshold value. For example, the bit error rate can be specified. If this is undershot, a relatively high quality of the transmission channel is present. If it is overshot, a relatively poor quality of the transmission channel is present. The bit error rate can be adjusted arbitrarily or can be taken from the specifications for the corresponding standard.

As already explained, the self-repeating, semi-persistently configured transmission resources 20 are preferably suitable for the transmission of VoIP data, because the codec which generates the VoIP data generates a new data packet only every 20 ms. However, this VoIP codec generates a new data packet regularly every 20 ms, so that a plurality of control data on the PDCCH can be saved by the semi-persistent transmission resources 20, especially since the VoIP data packets are relatively small. As a result, the overhead in the transmission of VoIP data falls significantly.

The control unit 11 according to the invention can also reduce the value $N_{SPS\text{-}Temp}$ for the number of HARQ process numbers to be reserved if the data rate from the transmitter unit 1 according to the invention to the at least one mobile-terminal device 2 rises. Conversely, the control unit 11 according to the invention can increase the number of HARQ process numbers to be reserved if the data rate of the transmitter unit 1 according to the invention to the at least one mobile-terminal device 2 falls.

Figure 5:
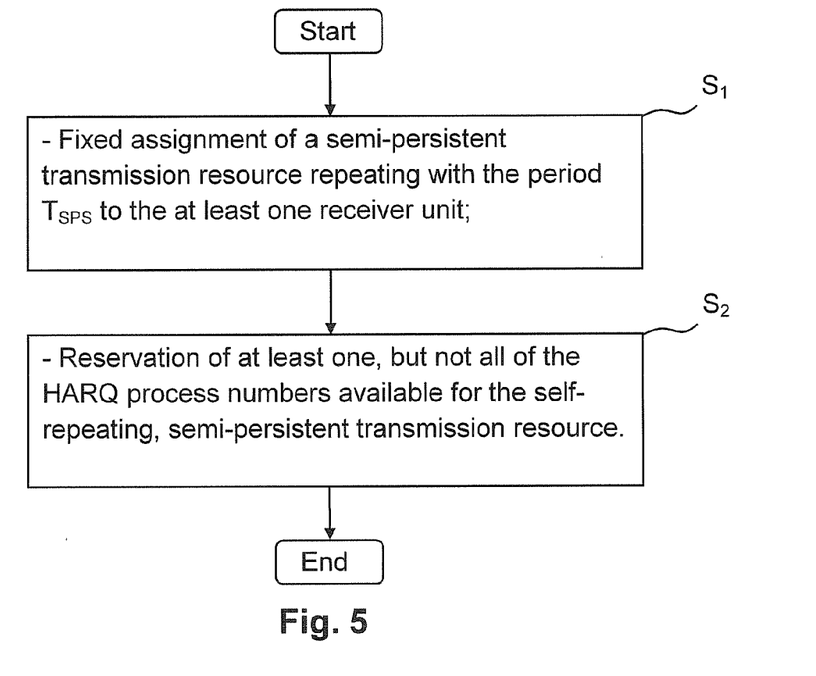
FIG. 5 an exemplary embodiment which describes a flow chart for the operation of the device according to the invention.

FIG. 5 shows an exemplary embodiment which describes a flow chart for operating the device 1 according to the invention. The method shown in FIG. 5 for operating the device 1 according to the invention is used for the detection and/or removal of errors in transmission systems and provides a transmitter unit 1 and at least one receiver unit 2, whereas the transmitter unit 1 transmits payload data to the at least one receiver unit 2 on a semi-persistent transmission resource 20, which provides an adjustable frequency range and an adjustable time period. In a first method step $S_1$, a self-repeating, semi-persistent transmission resource 20 repeating with the period $T_{SPS}$ is assigned to the at least one receiver unit 2. Following this, method step $S_2$ is carried out. In method step $S_2$, at least one but not all of the HARQ process numbers available for the self-repeating, semi-persistent transmission resource 20 are reserved. In this context, it is particularly advantageous that, in fact, not all of the HARQ process numbers available for the self-repeating, semi-persistent transmission resource 20 are reserved, so that some of these HARQ process numbers can be used additionally for other transmission resources 21 between the transmitter unit 1 and at least one receiver unit 2. This is especially necessary, for example, if the data rate on the other transmission resources 21 rises sharply, so that a secure detection and/or removal of errors is possible there.

Figure 6:
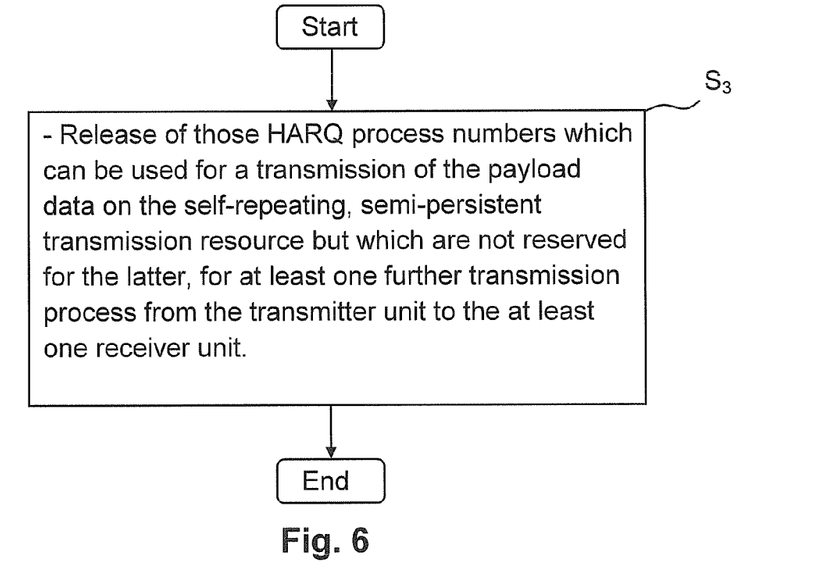
FIG. 6 a further exemplary embodiment which describes a flow chart for the operation of the device according to the invention.

FIG. 6 shows a further exemplary embodiment which describes a flow chart for operating the device 1 according to the invention. After method step $S_2$, method step $S_3$ is implemented. Within method step $S_3$, the HARQ process numbers which can be used for a transmission of the payload data on the self-repeating, semi-persistent transmission resource 20 but which have not been reserved for the latter, are released for at least one further transmission process from the transmitter unit 1 to the at least one receiver unit 2.

Figure 7:
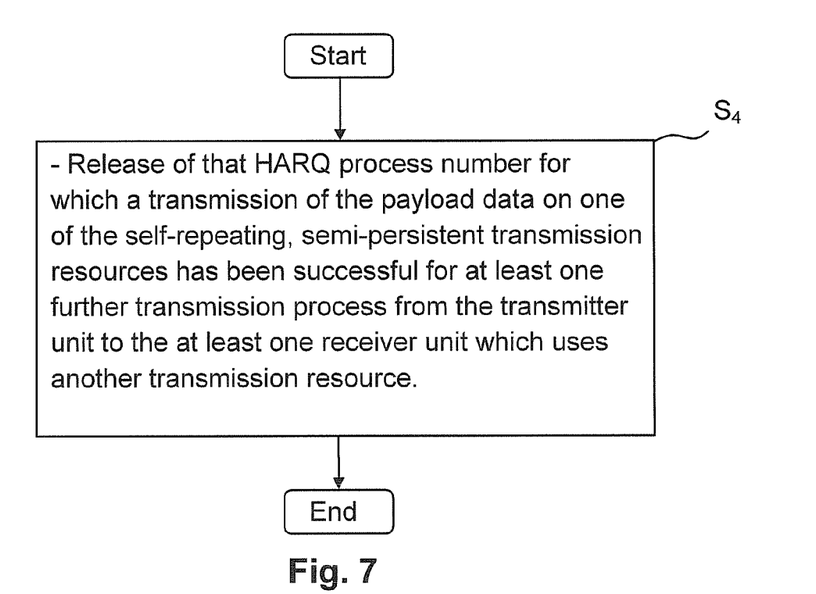
FIG. 7 a further exemplary embodiment which describes a flow chart for the operation of the device according to the invention.

FIG. 7 shows a further exemplary embodiment which describes a flow chart for operating the device 1 according to the invention. Within FIG. 7, which describes method step $S_3$ in greater detail, method step $S_4$ is carried out. Within method step $S_4$, the HARQ process numbers for at least one further transmission process from the transmitter unit 1 to the at least one receiver unit 2 are released, whereas this further transmission process uses a different transmission resource 21 and whereas the release is implemented when the transmission of the payload data on one of the self-repeating, semi-persistent transmission resources 20 has been successful. This ensures that the corresponding HARQ process number in the case of a transmission error is still available, so that a repetition of the transmission can take place immediately after this.

Figure 8:
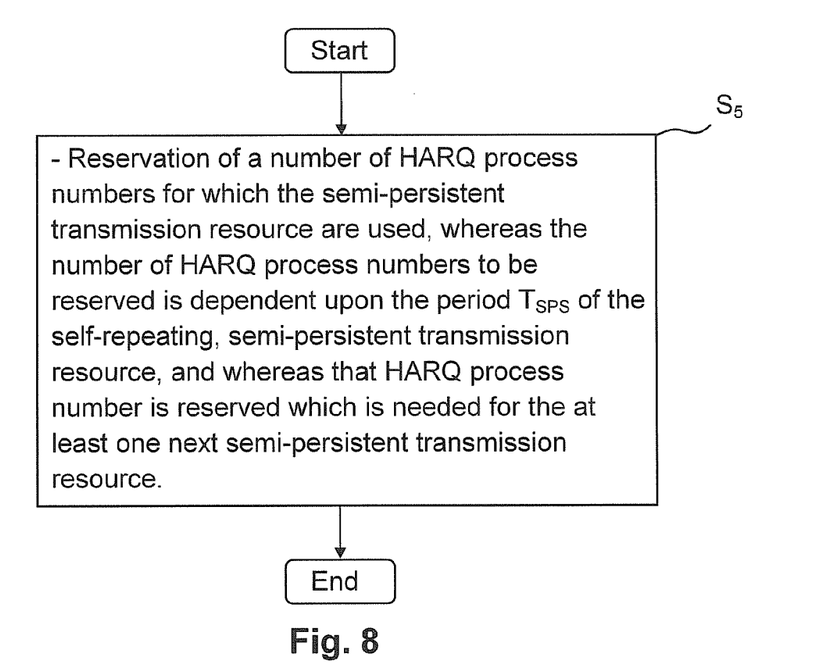
FIG. 8 a further exemplary embodiment which describes a flow chart for the operation of the device according to the invention.

FIG. 8 shows a further exemplary embodiment which describes a flow chart for the operation of the device 1 according to the invention. For this purpose, method step $S_5$, which explains method step $S_2$ in greater detail, is carried out. Within method step $S_5$, a number of HARQ process numbers which are used for the semi-persistent transmission resource 20 are reserved, whereas the number of HARQ process numbers to be reserved is dependent upon the period $T_{SPS}$ of the self-repeating, semi-persistent transmission resource 20 and whereas that HARQ process number is reserved, which is needed for the at least one next semi-persistent transmission resource 20. This ensures that the HARQ process number required for the transmission on the semi-persistent transmission resource 20 is always available. Moreover, only so many HARQ process numbers are reserved for the semi-persistent transmission resource 20 as are sufficient for the repetition of the transmission, whereas the number of repetitions is specified in such a manner that the payload data to be transmitted can be successfully transmitted with a very high probability.

Within the scope of the invention, all of the features illustrated and/or described can be combined with one another as required. In particular, the dependent claims relating to the method can also be combined with the device claims relating to the device and vice versa.

The invention claimed is:

1. A device for detection and/or removal of errors in transmission systems, said device comprising:
    a transmitter unit which transmits payload data to the at least one receiver unit on a semi-persistent transmission resource which provides an adjustable frequency range and an adjustable time period;
    a control unit which assigns a self-repeating, semi-persistent transmission resource repeating with the period semi-persistent scheduling is present in the transmitter unit; and reserves one but not all of the Hybrid Automatic Repeat Request (HARQ) process numbers available for the self-repeating, semi-persistent transmission resource,
    wherein the number of HARQ process numbers which are reserved for the semi-persistent transmission resource is varied dependent upon data volume on other transmission resources by the control unit, wherein the HARQ process number which is reserved is needed for at least one next semi-persistent transmission resource, a processing unit processing the payload data by means of turbo-coding, so that transmission errors are corrected in the receiver unit, wherein the device is associated with at least one of the following:

the semi-persistent transmission resource relates to radio resources which are configured semi-persistently by the control unit by means of semi-persistent scheduling (SPS) and are assigned to the receiver unit for a relatively longer time period than one subframe;

the transmitter unit is an LTE base-station, and the at least one receiver unit is an LTE receiver unit;

the control unit dynamically varies the number of HARQ process numbers to be reserved;

the control unit reduces the number in the case of a relatively higher data volume on the other transmission resources with reference to the semi-persistent transmission resource from the transmitter unit to the at least one receiver unit;

the control unit increases the number in the case of a low data volume on the other transmission resources with reference to the semi-persistent transmission resource;

fewer of the HARQ process numbers assigned for the semi-persistent transmission resource are reserved in the case of a relatively high quality of the transmission channel than in the case of a relatively poor quality of the transmission channel; and the payload data which are transmitted via the semi-persistent transmission resource are VoIP-data.

2. The device according to claim 1, wherein the control unit releases at least one HARQ process number which can be used for a transmission of the payload data on the self-repeating, semi-persistent transmission resource but which is not reserved for this transmission resource by the control unit for at least one further transmission process from the transmitter unit to the at least one receiver unit.

3. The device according to claim 1, wherein the control unit releases that HARQ process number for which a transmission of the payload data on one of the self-repeating, semi-persistent transmission resources has been successful, for at least one further transmission process which uses another transmission resource from the transmitter unit to the at least one receiver unit.

4. The device according to claim 1, wherein the control unit reserves the number of HARQ process numbers which are used for the semi-persistent transmission resource; wherein the number of HARQ process numbers to be reserved depends upon the period of the self-repeating, semi-persistent transmission resource.

5. The device according to claim 1, wherein the transmitter unit comprises:
a medium access control (MAC) layer; and
a physical layer for coding of HARQ processing.

* * * * *